United States Patent
Li Puma et al.

(10) Patent No.: US 7,301,411 B2
(45) Date of Patent: Nov. 27, 2007

(54) VOLTAGE-CONTROLLED OSCILLATOR CIRCUIT WITH ANALOGUE AND DIGITAL ACTUATION

(75) Inventors: Giuseppe Li Puma, Bochum (DE); Duyen Pham-Stäbner, Ratingen (DE); Georg Stabner, Ratingen (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/298,010

(22) Filed: Dec. 9, 2005

(65) Prior Publication Data

US 2006/0152292 A1 Jul. 13, 2006

(30) Foreign Application Priority Data

Dec. 13, 2004 (DE) .................. 10 2004 059 987

(51) Int. Cl.
*H03B 5/08* (2006.01)
(52) U.S. Cl. ............ 331/167; 331/117 R; 331/117 FE; 331/177 V; 331/179
(58) Field of Classification Search ............ 331/177 V, 331/179, 117 R, 167, 117 FE
See application file for complete search history.

(56) References Cited

U.S. PATENT DOCUMENTS

| 5,648,744 | A |  | 7/1997 | Prakash et al. ............... 331/11 |
| 5,686,864 | A |  | 11/1997 | Martin et al. ............... 331/1 A |
| 5,739,730 | A |  | 4/1998 | Rotzoll ..................... 331/177 |
| 6,133,797 | A |  | 10/2000 | Lovelace et al. ............ 331/17 |
| 6,621,362 | B2 |  | 9/2003 | Momtaz et al. ............. 331/117 |
| 6,853,261 | B1 | * | 2/2005 | Ling ......................... 331/100 |
| 2004/0095194 | A1 |  | 5/2004 | Gupta et al. ................. 331/16 |

FOREIGN PATENT DOCUMENTS

| DE | 3313868 | 11/1983 |
| DE | 103 12 436 A1 | 10/2004 |
| EP | 1 193 875 A1 | 4/2002 |
| GB | 2120478 | 4/1982 |
| WO | 00/67376 | 11/2000 |

* cited by examiner

Primary Examiner—Arnold Kinkead
(74) Attorney, Agent, or Firm—Dicke, Billig & Czaja, PLLC

(57) ABSTRACT

A VCO circuit (20) has a coil (21) and, in parallel therewith, a constant capacitance (24) and adjustable capacitance elements (22, 23). A first capacitance element (22) is formed by one or more varactors whose capacitance can be adjusted by an analogue adjusting voltage ($V_{tune}$), while a second capacitance element (23) is formed by an arrangement comprising a plurality of capacitors which can be actuated by a digital bit word VCWD[N:1]. Digital calibration for the VCO (20) is performed by determining whether the present adjusting voltage is within a particular voltage range and, if this is not the case, the digital bit word being incremented or decremented by a bit value.

15 Claims, 3 Drawing Sheets

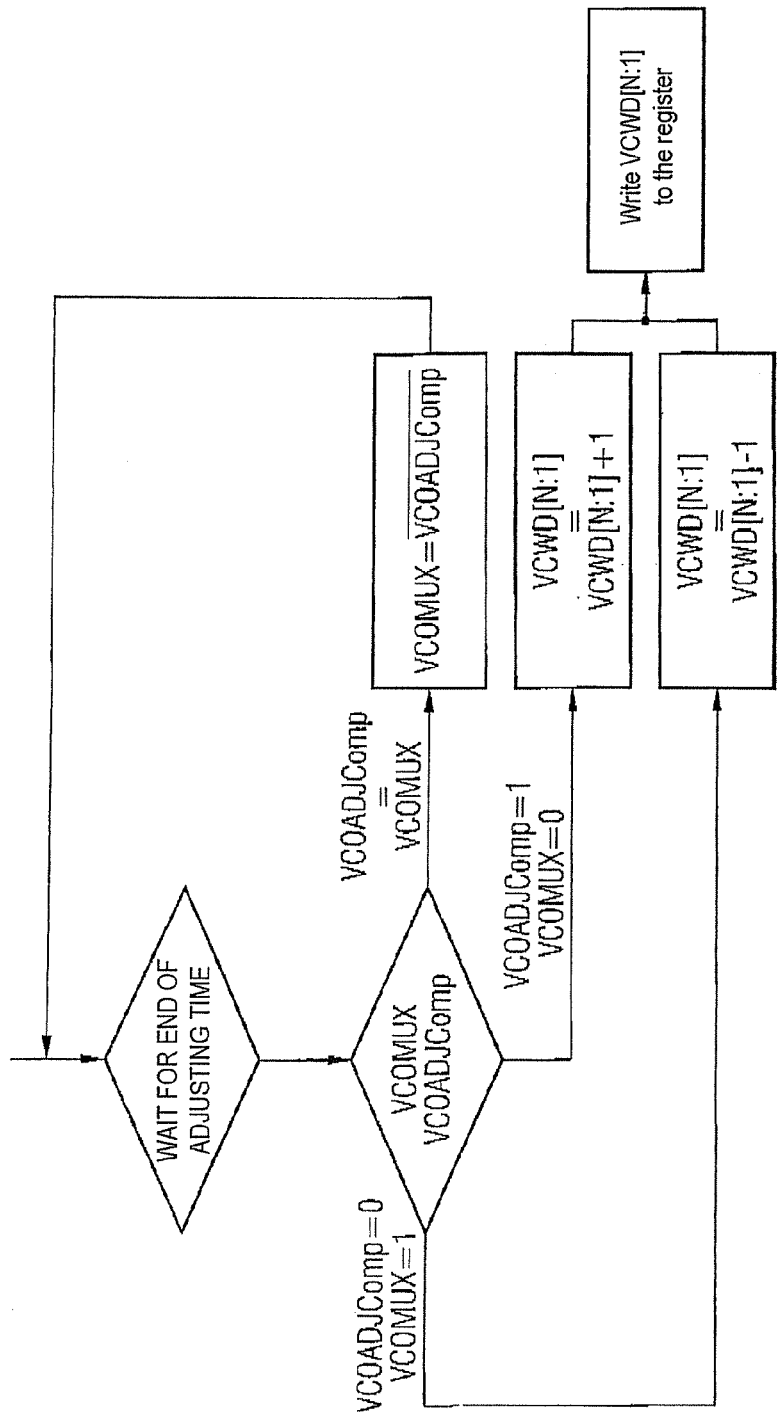

VOLTAGE-CONTROLLED OSCILLATOR CIRCUIT WITH ANALOGUE AND DIGITAL ACTUATION

CROSS-REFERENCE TO RELATED APPLICATION

This application claims priority from German Patent Application No. DE 10 2004 059 987.4, which was filed on Dec. 13, 2004, and is incorporated herein by reference in its entirety.

TECHNICAL FIELD

The invention relates to a voltage-controlled oscillator circuit.

BACKGROUND

A large number of electronic circuits today make use of voltage-controlled oscillators (VCOs). One particularly important field of application is mobile communication, in which a voltage-controlled oscillator is used within a phase-locked loop circuit in order to produce an output frequency with high stability and accuracy.

The most important chip technology for system-on-chip (SOC) applications today is CMOS technology. The continual reduction in the critical dimensions of this technology is accompanied by a reduction in the supply voltages too. Analogue circuit technologies are not compatible with this scaling performed for digital circuits, however. If the supply voltage is scaled using the circuit dimensions, the greatest impairment in a VCO circuit is a reduced tuning range. This means that only a smaller frequency range can be covered, which results in a problem for mass production on account of technological tolerances and temperature variations.

The VCO concepts known in the prior art typically use varactor diodes with a large tuning range in order to be able to cover the desired frequency range. FIG. 1 is a schematic illustration of a voltage-controlled oscillator circuit 10 based on the prior art. This LC resonant circuit contains coil elements 1.1 and 1.2 arranged in one circuit path and varactors 2.1 and 2.2 arranged in a circuit path connected in parallel therewith. The varactors 2.1 and 2.2 are voltage-dependent capacitance elements in which the capacitance can be adjusted variably within a particular prescribed range by an analogue voltage signal $V_{tune}$ which is supplied to the respective source inputs of said capacitance elements. The resonator is thus formed from the inductive coil elements 1.1 and 1.2 and the varactors 2.1 and 2.2. The two transistors 3.1 and 3.2 with the cross-coupled gates ensure the necessary ring gain through positive feedback. The output voltage signal from the VCO oscillator can be taken at the outputs A and B.

The capacitance range of the varactors 2.1 and 2.2, which determines the operating frequency range of the VCO circuit, needs to be designed such that allowance is also made for effects of temperature and process tolerances from the outset. However, the conventional VCO concept described has particular drawbacks on account of the fact that in submicron CMOS technology with critical dimensions of 0.13 µm, for example, the supply voltage is scaled, i.e. reduced, accordingly. One drawback is that the tuning range in this VCO circuitry is likewise reduced on account of the lower supply voltage. Since the capacitance ratio $C_{max}/C_{min}$ of the varactor diodes remains almost constant, the tuning range of the output frequency is reduced, since the supply voltage is reduced. It is therefore necessary to take suitable measures to ensure the full performance of the VCO circuit over the entire desired frequency range while taking into account production tolerances and temperature variations.

SUMMARY

It is therefore an object of the present invention to specify a voltage-controlled oscillator circuit which has a sufficiently large tuning range for the output frequency even at a reduced supply voltage.

This object can be achieved by a voltage-controlled oscillator circuit, comprising an inductive element, a first capacitive element having a voltage-dependent capacitance and being controlled by an analogue adjusting voltage, and an arrangement of second capacitive elements operable to be switched by a digital bit word in such a way as to form a capacitor with variable capacitance.

The circuit can further comprise a plurality of first capacitive elements with a voltage-dependent capacitance. The first capacitive element can be provided by a varactor. The circuit can further comprise a control device which stipulates whether the present analogue adjusting voltage is within a prescribed voltage range and, depending on the result, leaves the digital bit word at the present value or raises or lowers it by a bit value. The control device may contain a comparator which is supplied with the present adjusting voltage at a first input and with the upper or lower limit value of the prescribed voltage range at a second input. A Phase-locked loop may comprise such a voltage-controlled oscillator circuit.

In line with the generic type, the inventive voltage-controlled oscillator circuit has at least one inductive element and at least one first capacitive element which has a voltage-dependent capacitance and which can be actuated by an analogue adjusting voltage. The voltage-controlled oscillator circuit also has an arrangement of second capacitive elements which is able to be configured by means of actuation using a digital bit word.

The invention therefore provides a way of tuning the voltage-controlled oscillator circuit by means of actuation using the digital bit word.

In this context, provision may be made, in a manner which is known per se, for a plurality of first capacitive elements with a voltage-dependent capacitance to be provided. These may be provided by varactors or varactor diodes.

The arrangement of the second capacitive elements may be provided in a plurality of capacitive elements, such as capacitors, connected in parallel. This arrangement may for its part be connected in parallel with the inductive element and with the first capacitive element. The second capacitive elements may have capacitance values of identical magnitude. The arrangement may be able to be actuated by the digital bit word such that, depending on whether a bit position is set to 0 or 1, a capacitance addressed by means of this bit position is connected or disconnected by a switch.

In one preferred embodiment of the voltage-controlled oscillator circuit, the latter additionally contains a control device which stipulates whether the present analogue adjusting voltage supplied to the varactors is within a prescribed voltage range. Depending on the result, the control device either leaves the digital bit word supplied to the arrangement of second capacitive elements at the present value or raises or lowers it by a bit. For this purpose, the control device may contain a comparator which is supplied with the present adjusting voltage at a first input and with the upper or lower limit value of the prescribed voltage range at a second input.

The voltage-controlled oscillator circuit is normally part of a phase-locked loop. Digital control of the VCO can be performed in various situations or at various times of operation of the phase-locked loop or of the transmission/reception circuit. Provision may be made for the entire adjustable frequency range to be divided into a number of groups, each of which comprises a particular number of transmission or reception channels. The digital control can then be performed first of all for each channel in each group before transmission or reception operation is started. Whenever the digital control is performed, the end of the locking time of the phase-locked loop with the present settings of the VCO is first of all awaited and then the corrected digital bit word is ascertained and stored. When the transmission/reception apparatus then changes to the active transmission or reception mode at a later time, selection of a particular frequency channel respectively involves the respective stored digital bit word being called from the register and supplied to the VCO.

BRIEF DESCRIPTION OF THE DRAWINGS

The invention is explained in more detail below using exemplary embodiments in conjunction with the figures of the drawing, in which:

FIG. 4 shows an exemplary embodiment of a flowchart to illustrate the flow of the digital control.

DETAILED DESCRIPTION

Figure 1:
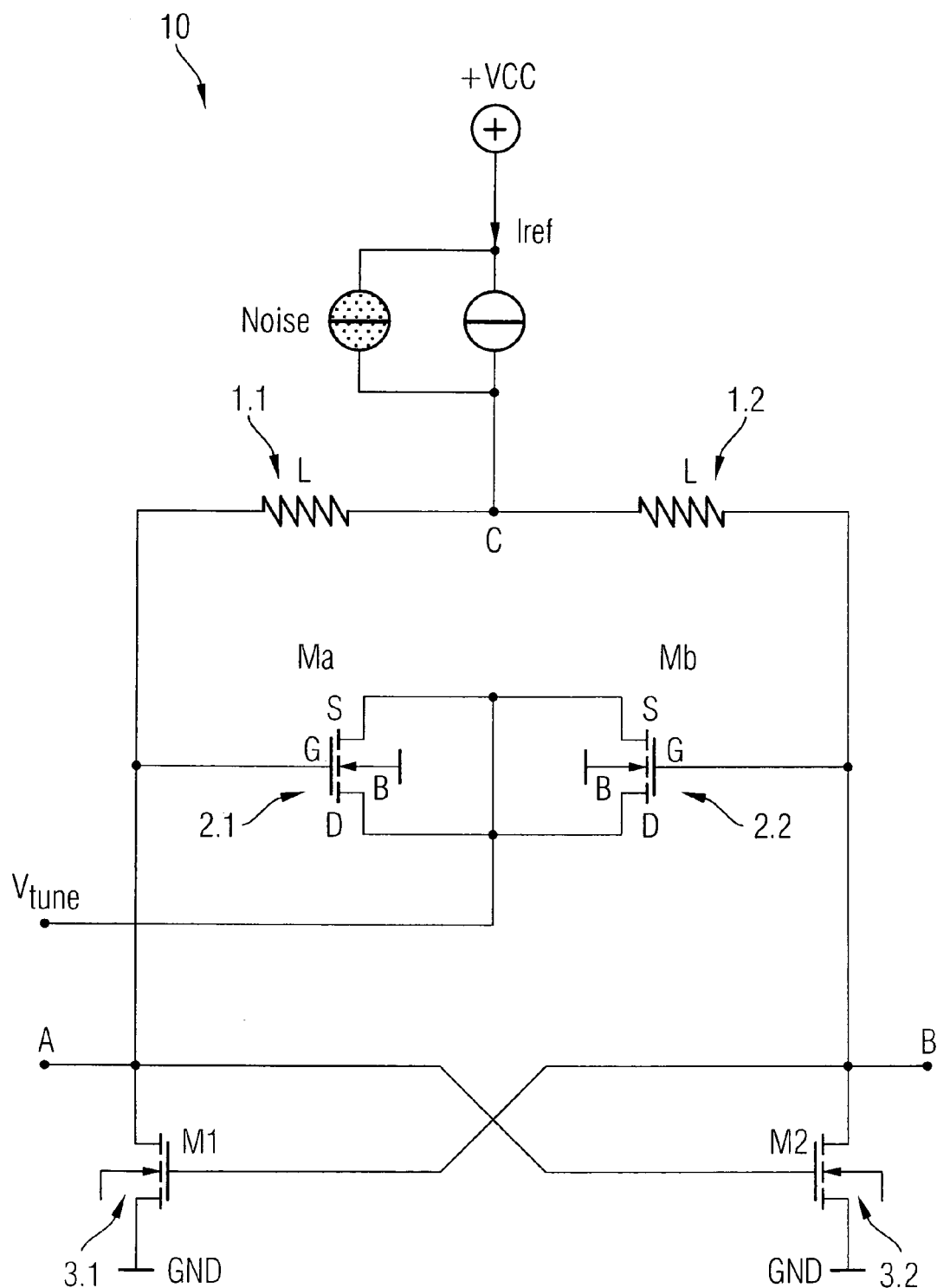
FIG. 1 shows a conventional voltage-controlled LC circuit.
Figure 2:
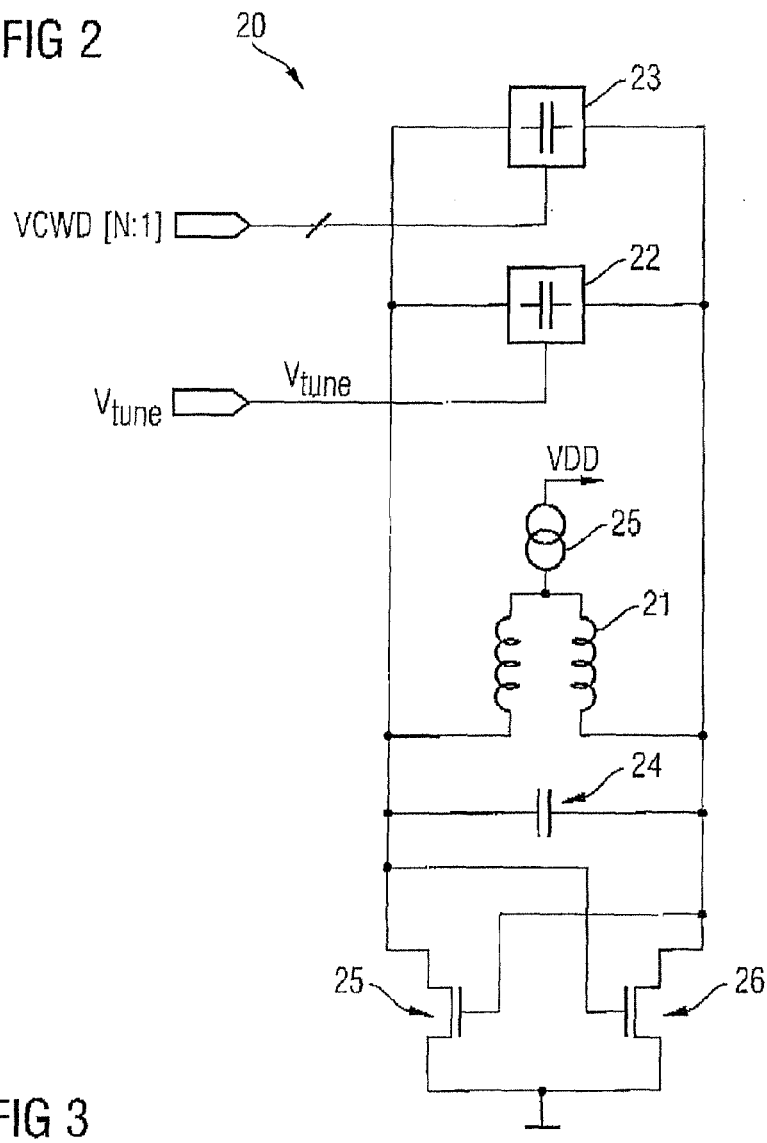
FIG. 2 shows an exemplary embodiment of an inventive voltage-controlled LC circuit with a digital capacitance array and an analogue-controlled varactor.

FIG. 2 shows an exemplary embodiment of an inventive voltage-controlled oscillator circuit (VCO) 20. The input of a current source 25 is connected to the supply voltage VDD, and its output is connected to a coil 21. The coil 21 is connected in parallel with a capacitor 24 having a constant capacitance and with actuatable capacitance elements 22 and 23 having respectively variable capacitances. The coil 21 and the capacitance elements 22 to 24 form the LC resonant circuit. The transistors 25 and 26 which are connected in parallel with these circuit elements, and which have the cross-coupled gates, ensure the necessary ring gain through positive feedback.

The capacitance element 22 actuated by the analogue adjusting voltage $V_{tune}$ may contain one or more varactors, i.e. capacitors having a voltage-dependent capacitance. The capacitance element 23 is an arrangement or an array of capacitors which are actuated by a digital bit word VCWD [N:1]. The capacitors contained therein have a standard prescribed capacitance value, for example, and can be actuated individually bit by bit. By way of example, raising the digital bit word by one bit allows a capacitance to be connected, while lowering the digital bit word by one bit disconnects a capacitance.

The adjusting voltage's limited tuning range means that the VCO circuit needs to be controlled and aligned relative to the mid-frequency before switching to the active transmission or reception mode. Alternatively, provision may be made for ongoing control and alignment of the VCO to be provided during an operating mode. The frequency range to be covered by the VCO is divided into a number of groups, each of which comprises eight frequency channels, for example.

The digital adjustment or calibration of the VCO is based on the idea that the adjusting voltage for each of the frequencies which are to be adjusted within a frequency range needs to be within a defined voltage range. This means a comparator can be used in order to compare the adjusting voltage used at present with the upper or lower limit value of the defined frequency range. Depending on the result of the comparison, the digital bit word VCWD[N:1] is raised or lowered by one bit.

Figure 3:
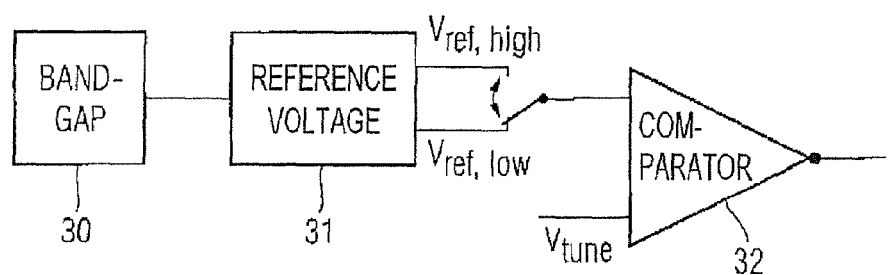
FIG. 3 shows an exemplary embodiment of the generation of the reference voltages and the input of one of the reference voltages and the adjusting voltage into a comparator.

FIG. 3 shows a block diagram of the generation of the two reference voltages and of the comparison with the adjusting voltage. This circuit is used to check whether the present adjusting voltage is within the prescribed voltage window. To this end, two reference voltages $V_{ref,low}$ (lower window limit) and $V_{ref,high}$ (upper window limit) are generated from a bandgap circuit 30 and a downstream reference voltage circuit 31. These reference voltages derived from the reference voltage circuit 31 are frequency values which are usually typical of a particular VCO. Depending on the position of a switch, one of the two reference voltages is input into a first input of a comparator 32, while the present adjusting voltage $V_{tune}$ is input into the second input of the comparator 32. The control is effected such that the phase-locked loop (PLL), of which the VCO is part, locks and, when the locking or adjusting time for the PLL has elapsed, the adjusting or tuning voltage is successively compared with the reference voltage values $V_{ref,low}$ and $V_{ref,high}$. If the tuning voltage is within the voltage window, control is complete and the VCO is aligned. If the tuning voltage is above $V_{ref,high}$ or below $V_{ref,low}$, the capacitance array 23 is incremented or decremented by a capacitance value by the digital bit word.

FIG. 4 shows a schematic flowchart of the flow of control. If the value VCOMUX therein equals 1, the tuning voltage is compared with the upper reference voltage value, and if the value VCOMUX=0 then the tuning voltage is compared with the lower reference voltage value. The value VCOAD-JComp is the output value from the comparator. The adjusting algorithm is executed as follows:

1. The locking or adjusting time for the PLL is set.
2. The reference voltage is adjusted to the lower or the upper reference voltage value (by means of the switch position in FIG. 3).
3. The desired mid-frequency MidFreq and the relevant group number GroupNo are selected.
4. Calibration starts: an internal counter is set on the basis of the locking time.
5. When the counter reaches the value "0", this signals that the PLL has locked and the comparator output is being read by the digital part. Depending on the compared voltage value (see step 2), VCWD[N:1] is raised or lowered by one bit value. The counter is loaded with the locking time again. As soon as the comparator output indicates that a limit value has been exceeded or undershot, the reference voltage is changed to the other limit value.
6. The last step is repeated until the desired tuning voltage is within the voltage window.
7. The last value of VCWD[N:1] is stored in the associated register.

The sequence described above is performed for each channel in each group. In the active operating mode, for each desired channel the correct value of the digital bit word VCWD[N:1] is applied to the VCO before the PLL is activated.

What is claimed is:

1. A voltage-controlled oscillator circuit, comprising:
   at least one inductive element,
   at least one first capacitive element which has a voltage-dependent capacitance and which can be actuated by an analogue adjusting voltage, and
   an arrangement of second capacitive elements which is able to be configured by means of actuation using a digital bit word,
   a control device for determining whether a present analogue adjusting voltage is within a prescribed voltage range and, depending on the determination, leaves the digital bit word at the present value or raises or lowers it by a bit value, wherein
   the control device comprises a comparator which is supplied with the present adjusting voltage at a first input and with the upper or lower limit value of the prescribed voltage range at a second input in a way that the second input is switchably connected for receiving either the upper limit value or the lower limit value of the prescribed voltage range.

2. A voltage-controlled oscillator circuit according to claim 1, comprising a plurality of first capacitive elements with a voltage-dependent capacitance.

3. A voltage-controlled oscillator circuit according to claim 1, wherein
   the first capacitive element is provided by a varactor.

4. A voltage-controlled oscillator circuit according to claim 1, further comprising
   a control device which stipulates whether the present analogue adjusting voltage is within a prescribed voltage range and, depending on the result, leaves the digital bit word at the present value or raises or lowers it by a bit value.

5. A voltage-controlled oscillator circuit according to claim 4, wherein
   the control device contains a comparator which is supplied with the present adjusting voltage at a first input and with the upper or lower limit value of the prescribed voltage range at a second input.

6. A Phase-locked loop comprising a voltage-controlled oscillator circuit according to claim 1.

7. A voltage-controlled oscillator circuit, comprising:
   an inductive element,
   a first capacitive element having a voltage-dependent capacitance and being controlled by an analogue adjusting voltage, and
   an arrangement of second capacitive elements operable to be switched by a digital bit word in such a way as to form a capacitor with variable capacitance.

8. A voltage-controlled oscillator circuit according to claim 7, comprising a plurality of first capacitive elements with a voltage-dependent capacitance.

9. A voltage-controlled oscillator circuit according to claim 7, wherein the first capacitive element is a varactor.

10. A Phase-locked loop comprising a voltage-controlled oscillator circuit according to claim 7.

11. A method of operating a voltage-controlled oscillator circuit, comprising an inductive element, a first capacitive element having a voltage-dependent capacitance, and an arrangement of second capacitive elements, the method comprising the steps of:
    adjusting the capacitance of the first capacitive element by an analogue adjusting voltage; and
    switching a plurality of second capacitive elements on and off according to a digital bit word in such a way as to form a capacitor with variable capacitance,
    determining whether the present analogue adjusting voltage is within a prescribed voltage range by supplying a comparator with a present adjusting voltage at a first input and with the upper or lower limit value of the prescribed voltage range at a second input in a way that the second input is switchably connected for receiving either the upper limit value or the lower limit value of the prescribed voltage range;
    depending on the determination, leaving the digital bit word at the present value or raising or lowering it by a bit value.

12. A method according to claim 11, wherein a plurality of first capacitive elements with a voltage-dependent capacitance is provided.

13. A method according to claim 11, wherein the first capacitive element is a varactor.

14. A method according to claim 11, comprising the step of using the method within a Phase-locked loop.

15. A method according to claim 14, comprising the steps of:
    setting a locking or adjusting time for the PLL;
    adjusting a reference voltage to a lower or an upper reference voltage value;
    selecting a desired mid-frequency and a relevant group number;
    calibrating the PLL by adjusting the second capacitive elements.

* * * * *